US006002141A

United States Patent [19]

Niigaki et al.

[11] Patent Number: 6,002,141

[45] Date of Patent: *Dec. 14, 1999

[54] METHOD OF USING PHOTOCATHODE AND METHOD OF USING ELECTRON TUBE

[75] Inventors: Minoru Niigaki; Toru Hirohata; Masami Yamada; Katsuyuki Kinoshita, all of Hamamatsu, Japan

[73] Assignee: Hamamatsu Photonics K.K., Hamamatsu, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/562,580

[22] Filed: Nov. 24, 1995

[30] Foreign Application Priority Data

Feb. 27, 1995 [JP] Japan .................................... 7-038852

[51] Int. Cl.[6] ............................ H01L 29/06; H01L 29/12

[52] U.S. Cl. ............................................................... 257/10

[58] Field of Search ................................................ 257/10

[56] References Cited

U.S. PATENT DOCUMENTS

| | | | |
|---|---|---|---|
| 3,958,143 | 5/1976 | Bell | 313/94 |
| 5,047,821 | 9/1991 | Costello et al. | 357/30 |
| 5,336,902 | 8/1994 | Nigaki et al. | 257/10 |
| 5,404,026 | 4/1995 | Mariella, Jr. . | |

FOREIGN PATENT DOCUMENTS

| | | | |
|---|---|---|---|
| 226 503 | 1/1987 | European Pat. Off. | 257/11 |
| 0 558 308 | 9/1993 | European Pat. Off. . | |
| 58-147616 | 9/1983 | Japan . | |
| 63-72050 | 4/1988 | Japan . | |
| 5-234501 | 9/1993 | Japan . | |

*Primary Examiner*—Stephen D. Meier
*Attorney, Agent, or Firm*—Pillsbury Madison & Sutro

[57] ABSTRACT

The present invention is to provide a method of using a photocathode including a laminated heterostructure of Group III–V semiconductors, which is constituted by a p-type light-absorbing layer formed on a p-type substrate and a p-type electron-emitting layer formed on the light-absorbing layer, a first electrode formed to have a rectifying function with respect to the electron-emitting layer, and a second electrode formed in ohmic contact with the substrate, wherein a voltage necessary and sufficient to form a potential gradient throughout the light-absorbing layer is applied between the first electrode and the second electrode, thereby accelerating photoelectrons excited in the light-absorbing layer which absorbs external incident light on the basis of an electric field formed in the light-absorbing layer and the electron-emitting layer and emitting the photoelectrons from the electron-emitting layer. The accelerated electrons largely decrease differences in transit time until reaching the emission surface of the electron-emitting layer as compared to diffused electrons. Therefore, the response speed of the photocathode for detecting external incident light is increased.

17 Claims, 8 Drawing Sheets

METHOD OF USING PHOTOCATHODE AND METHOD OF USING ELECTRON TUBE

BACKGROUND OF THE INVENTION

1. Field of the Invention

The present invention relates to a method of using a photocathode for emitting photoelectrons generated upon incidence of light, and a method of using an electron tube using the method of using a photocathode.

2. Related Background Art

In conventionally available electron tubes including photomultipliers, image intensifiers, and streak tubes, a photocathode consisting of an alkali metal compound or a Group III–V compound semiconductor is generally used.

Photoelectrons excited in such a photocathode upon incidence of light move while being diffused. The photoelectrons reach the electron emission surface via various routes without taking the shortest route. For this reason, the difference in moving distances between the photoelectrons directly results in differences (variations) in transit time of photoelectrons. After all, the differences in transit time of photoelectrons in the photocathode are caused by the limited thickness of the photocathode.

From the view point of quantum efficiency of photoelectric conversion, particularly when light having a relatively long wavelength is to be detected, light absorption in the photocathode occurs at a deep position from the light incident surface. Therefore, in a reflection type photocathode, as the wavelength of incident light becomes longer, the moving distance of photoelectrons reaching the electron emission surface becomes larger accordingly. In a transmission type photocathode, as the wavelength of incident light becomes longer, the photocathode must be made thicker.

In a photocathode, therefore, quantum efficiency in photoelectric conversion and differences in transit time of photoelectrons are contrary to each other. Photocathodes capable of improving both of them have not been put in practice yet.

There is a photocathode for detecting light having a relatively long wavelength, in which an InGaAsP active layer, an InP emitter layer, and an Ag protective layer are sequentially formed on an InP substrate. In this transition electron type photocathode, a bias voltage for optimizing the S/N ratio is applied on the basis of a balance between an increase in quantum efficiency of photoelectric conversion according to an increase in bias voltage, and an increase in dark current generated upon injection of holes from an electrode.

Note that a prior art associated with such a transition electron type photocathode is disclosed in, e.g., U.S. Pat. No. 3,958,143 in detail.

SUMMARY OF THE INVENTION

It is an object of the present invention to provide a method of using a photocathode which decreases differences in transit time of photoelectrons to increase the response speed of photodetection, and a method of using an electron tube such as a photomultiplier, an image intensifier, or a streak tube, which uses the method of using the photocathode.

In order to achieve the above object, according to the present invention, there is provided a method of using a photocathode comprising a laminated heterostructure of Group III–V semiconductors, which is constituted by a p-type light-absorbing layer formed on a p-type substrate and a p-type electron-emitting layer formed on the light-absorbing layer, a first electrode formed to have a rectifying function with respect to the electron-emitting layer, and a second electrode formed in ohmic contact with the substrate, wherein a voltage necessary and sufficient to form a potential gradient throughout the light-absorbing layer is applied between the first electrode and the second electrode, thereby accelerating photoelectrons excited in the light-absorbing layer which absorbs external incident light on the basis of an electric field formed in the light-absorbing layer and the electron-emitting layer and emitting the photoelectrons from the electron-emitting layer.

In order to achieve the above object, according to the present invention, there is also provided a method of using an electron tube having a photocathode comprising a laminated heterostructure of Group III–V semiconductors, which is constituted by a p-type light-absorbing layer formed on a p-type substrate and a p-type electron-emitting layer formed on the light-absorbing layer, a first electrode formed to have a rectifying function with respect to the electron-emitting layer, and a second electrode formed in ohmic contact with the substrate, wherein a voltage necessary and sufficient to form a potential gradient throughout the light-absorbing layer is applied between the first electrode and the second electrode, thereby accelerating photoelectrons excited in the light-absorbing layer which absorbs external incident light on the basis of an electric field formed in the light-absorbing layer and the electron-emitting layer and emitting the photoelectrons from the electron-emitting layer.

In the method of using the photocathode or the electron tube, a pulse voltage may be applied between the first electrode and the second electrode to operate the photocathode as an electron gate.

In the method of using the photocathode or the electron tube, a necessary and sufficient voltage is applied between the first electrode and the second electrode, which are arranged to sandwich the laminated heterostructure of Group III–V compound semiconductors including the substrate, the light-absorbing layer, and the electron-emitting layer, thereby forming a potential gradient throughout the light-absorbing layer.

With this arrangement, all photoelectrons excited in the light-absorbing layer drift along the potential gradient formed in the light-absorbing layer. For this reason, all the photoelectrons reaching the emission surface of the electron-emitting layer are accelerated on the basis of the electric field formed in the light-absorbing layer and the electron-emitting layer. These electrons include no electrons diffused and moved without being influenced by the electric field in the light-absorbing layer and the electron-emitting layer.

These accelerated electrons largely decrease differences in transit time until reaching the emission surface of the electron-emitting layer as compared to diffused elections generated at the same excitation position in the light-absorbing layer. Therefore, the response speed of the photocathode for detecting external incident light is increased.

When a pulse voltage is applied between the first electrode and the second electrode to operate the photocathode as an electron gate, the photocathode functions as an electron gate which easily and quickly operates.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
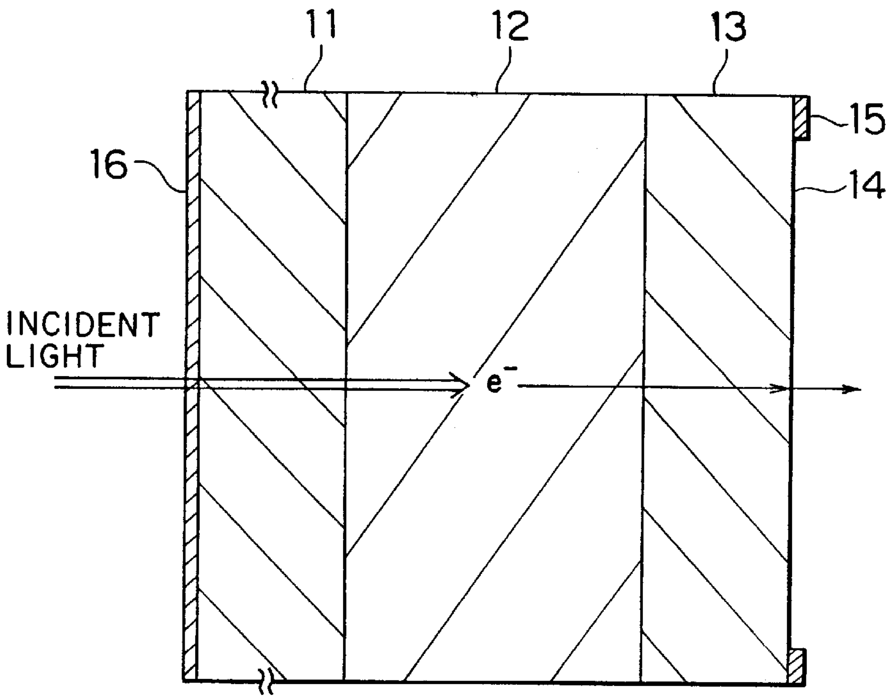
FIG. 1A is a sectional view schematically showing the structure of a transmission type photocathode applied to the first embodiment according to the present invention.

The arrangements and functions of embodiments according to a method of using a photocathode or an electron tube of the present invention will be described below in detail with reference to FIGS. 1 to 11. The same reference numerals denote the same elements throughout the drawings, and a detailed description thereof will be omitted. The dimensional ratios in the drawings do not necessarily coincide with those in the description.

First Embodiment

In this embodiment, a bias voltage higher than the conventional voltage for optimizing the S/N ratio is applied to a transition electron type photocathode, thereby forming a potential gradient throughout a light-absorbing layer. With this arrangement, all photoelectrons excited by external incident light become accelerated electrons on the basis of an electric field formed in the photocathode. Therefore, this embodiment largely decreases differences in transit time of photoelectrons.

Figure 1B:
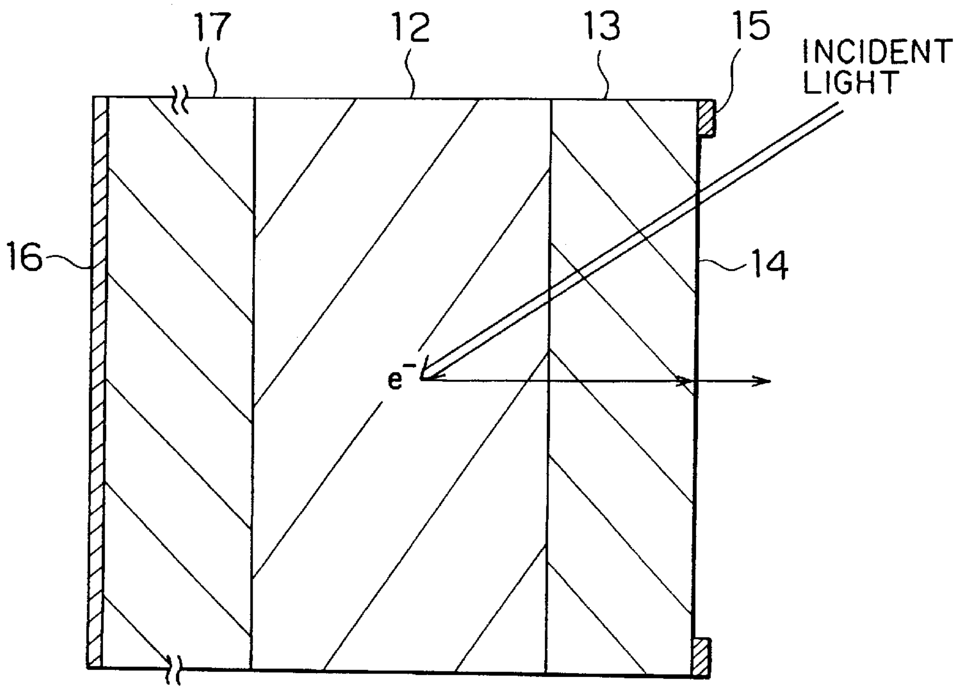
FIG. 1B is a sectional view schematically showing the structure of a reflection type photocathode applied to the first embodiment according to the present invention.

As shown in FIG. 1A, in a transmission type photocathode, a light-absorbing layer 12 and an electron-emitting layer 13 are sequentially formed on a transparent substrate 11. In a reflection type photocathode, as shown in FIG. 1B, the light-absorbing layer 12 and the electron-emitting layer 13 are sequentially formed on a support substrate 17. A thin film (not shown) consisting of Cs, an oxide of Cs, or a fluoride of Cs is formed on the surface of the electron-emitting layer 13 to decrease the work function of the electron-emitting layer 13.

Each of the two photocathodes is formed as a laminated heterostructure of Group III–V compound semiconductors. More specifically, the transparent substrate 11 or the support substrate 17 is formed of $p^+$-InP, the light-absorbing layer 12 is formed of $p^-$-$In_xGa_{1-x}As_yP_{1-y}$ ($0 \leqq x \leqq 1$, $0 \leqq y \leqq 1$), and the electron-emitting layer 13 is formed of $p^-$-InP.

In the laminated heterostructure of the Group III–V compound semiconductors, the carrier concentration of the transparent substrate 11 or the support substrate 17 is preferably about $10^{18}$ cm$^{-3}$ or more. The carrier concentrations of the light-absorbing layer 12 and the electron-emitting layer 13 are preferably about $5\times10^{15}$ to $50\times10^{15}$ cm$^{-3}$. The thickness of the light-absorbing layer 12 is preferably about 1 to 3 $\mu$m. The thickness of the electron-emitting layer 13 is preferably about 0.3 to 1 $\mu$m. However, the carrier concentration and thickness of each layer are not necessarily limited as described above.

In this embodiment, the above InP/InGaAsP compound semiconductors are exemplified. However, the materials are not necessarily limited to those. As materials suitable for the photocathode, materials formed of Group III–V compound semiconductors or materials having a heterostructure thereof, which are disclosed in, e.g., U.S. Pat. No. 3,958,143 or Japanese Patent Laid-Open No. 5-234501, can also be applied.

A Schottky electrode 15 consisting of Al is formed on an emission surface 14 of the electron-emitting layer 13 to be in Schottky contact with the electron-emitting layer 13. An ohmic electrode 16 consisting of AuGe is formed on the lower surface of the transparent substrate 11 or the support substrate 17 to be in ohmic contact with the transparent substrate 11 or the support substrate 17.

The materials of the Schottky electrode 15 and the ohmic electrode 16 are not necessarily limited as described above. Any material can be used for the Schottky electrode 15 as long as it has a good Schottky contact with the electron-emitting layer 13. For example, at least one metal selected from the group consisting of Ag, Au, Ni, W, and WSi, or an alloy thereof may also be applied. In addition, any material can be used for the ohmic electrode 16 as long as it has a good ohmic contact with the transparent substrate 11 or the support substrate 17.

Figure 2A:
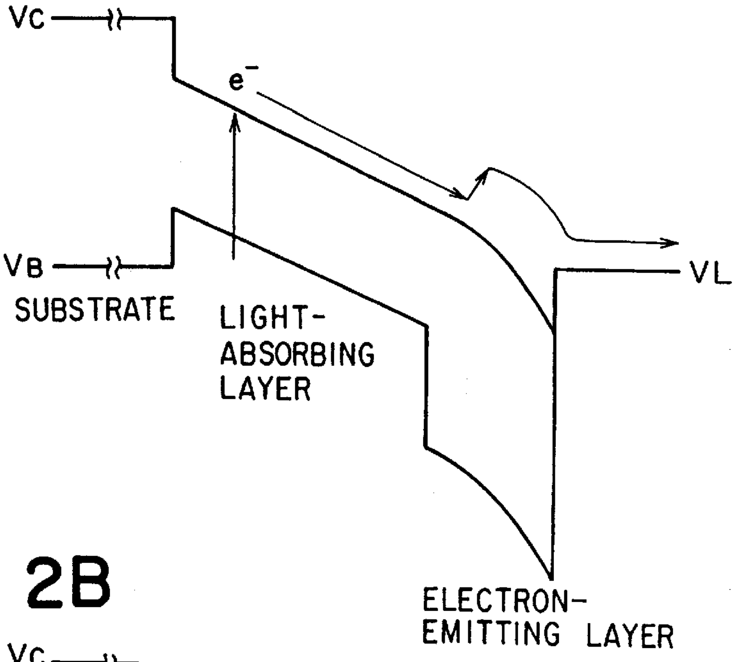
FIG. 2A is an energy band diagram of the laminated heterostructure of Group III–V compound semiconductors in the photocathode shown in FIG. 1A or 1B, which is observed when a bias voltage of the present invention is applied.

In the transition electron type photocathode with the above arrangement, a bias voltage applied to the Schottky electrode 15 and the ohmic electrode 16 is set to a value necessary and sufficient to extend a depletion layer from the Schottky electrode 15 throughout the light-absorbing layer 12. Therefore, as shown in FIG. 2A, a potential gradient is formed throughout the light-absorbing layer 12.

At this time, all photoelectrons $e^-$ excited by external incident light are accelerated on the basis of an electric field in the light-absorbing layer 12 and the electron-emitting layer 13. All photoelectrons $e^-$ excited upon incidence of light become accelerated electrons transited in almost the same direction toward the emission surface 14 of the electron-emitting layer 13 at the same speed. For this reason, differences in transit time of photoelectrons obviously become very small.

Figure 2B:
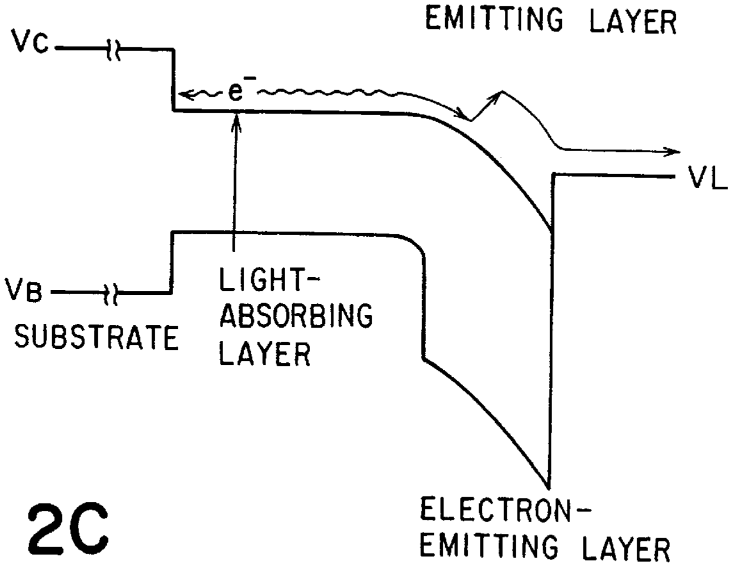
FIG. 2B is an energy band diagram of the laminated heterostructure of the Group III–V compound semiconductors in the photocathode shown in FIG. 1A or 1B, which is observed when a conventional bias voltage is applied.

On the other hand, when the conventional bias voltage for optimizing the S/N ratio is applied to the Schottky electrode 15 and the ohmic electrode 16, a potential gradient is formed in only the thin surface portion of the light-absorbing layer 12 close to the electron-emitting layer 13, as shown in FIG. 2B.

Figure 3:
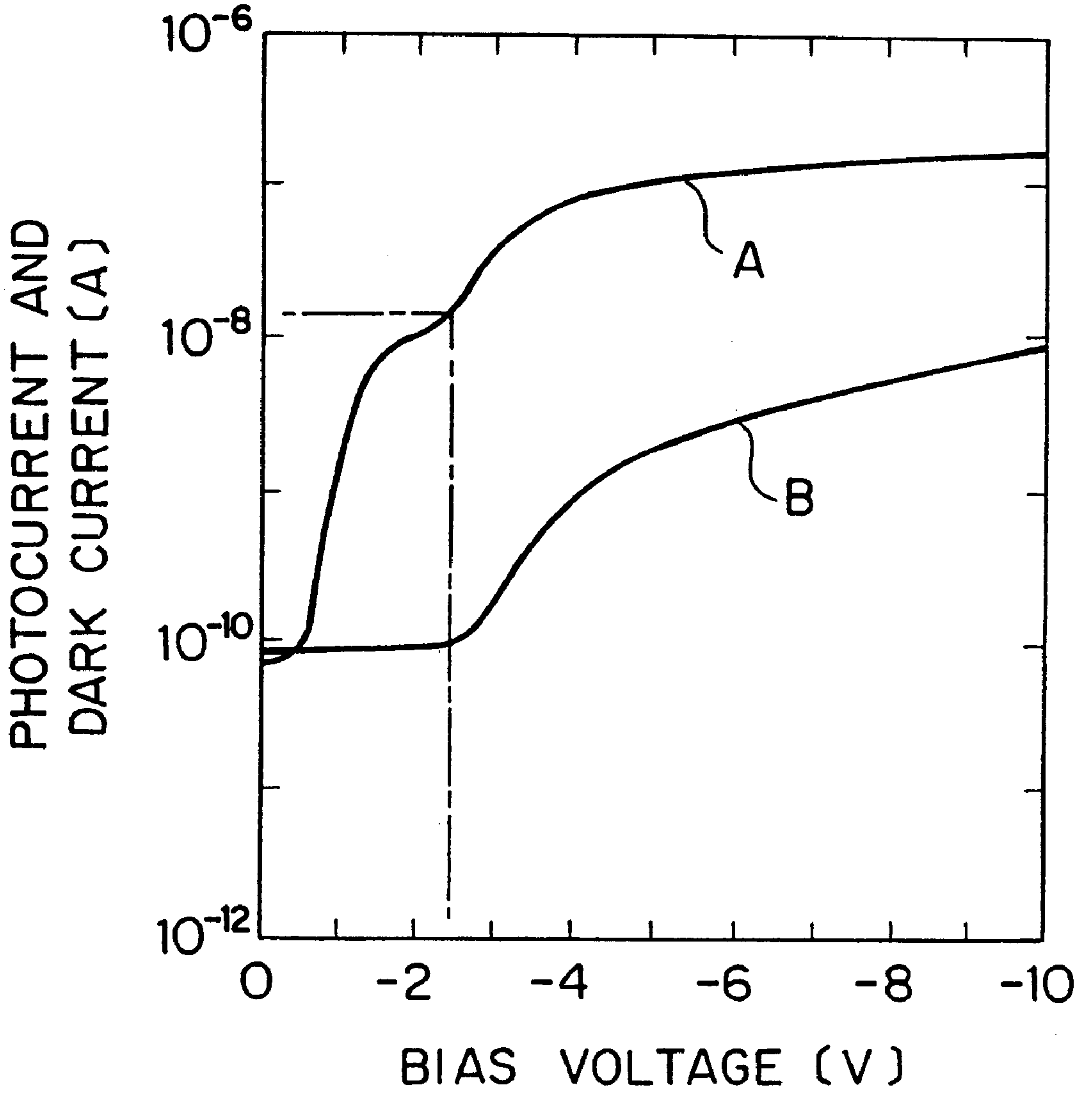
FIG. 3 is a graph showing changes in photosensitivity and dark current with respect to a change in bias voltage in the photocathode shown in FIG. 1A or 1B.

Referring to FIG. 3, a bias voltage [V] is plotted along the abscissa in units of 1.000/div, and a photocurrent and a dark current [A] are plotted along the ordinate in units of decade/div. A photocurrent with respect to a bias voltage is represented by a characteristic curve A, and a dark current with respect to a bias voltage is represented by a characteristic curve B. In this case, when the bias voltage for maximizing the S/N ratio is applied, the photosensitivity is not maximized.

More specifically, the photoelectrons $e^-$ excited by incident light include not only the accelerated electrons transited toward the emission surface 14 but also diffused electrons transited not toward the emission surface 14 but in different directions. Some slow diffused electrons can reach the emission surface 14 almost within the average lifetime of electrons, so that differences in transit time of the photoelectrons become several $\mu$s.

Figure 2C:
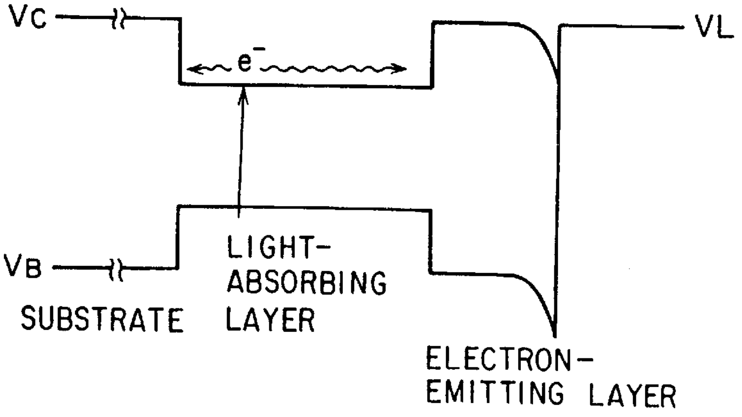
FIG. 2C is an energy band diagram of the laminated heterostructure of the Group III–V compound semiconductors in the photocathode shown in FIG. 1A or 1B, which is observed when no bias voltage is applied.

When no bias voltage is applied to the Schottky electrode 15 and the ohmic electrode 16, no potential gradient is formed in the light-absorbing layer 12, as shown in FIG. 2C. At this time, the photoelectrons $e^-$ excited by incident light include only diffused electrons transited not toward the emission surface 14 but in different directions. The diffused electrons are not emitted into the vacuum because of a conduction band barrier formed in the electron-emitting layer 13.

As described above, in this embodiment, a potential gradient is formed throughout the light-absorbing layer 12 of the photocathode. All the photoelectrons excited upon incidence of light are accelerated on the basis of an electric field in the light-absorbing layer 12 and the electron-emitting layer 13. For this reason, the photoelectrons reaching the emission surface 14 include only accelerated electrons and no diffused electron. Therefore, differences in transit time of photoelectrons can be largely decreased to realize a photocathode with a high response speed.

Second Embodiment

In this embodiment, a bias voltage higher than the conventional voltage for optimizing the S/N ratio is applied to a transition electron type photocathode formed by partially modifying the arrangement of the photocathode of the first embodiment, thereby forming a potential gradient throughout a light-absorbing layer.

Figure 4:
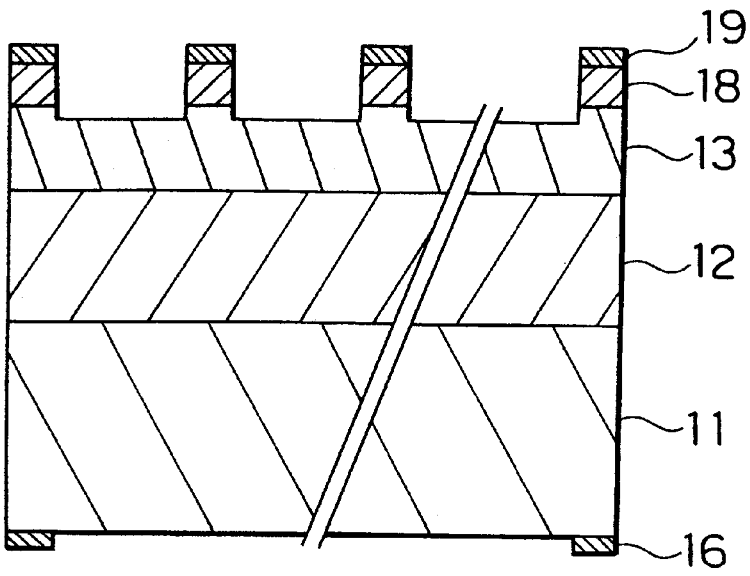
FIG. 4 is a sectional view schematically showing the structure of a transmission type photocathode applied to the second embodiment according to the present invention.

As shown in FIG. 4, in the photocathode of this embodiment, an $n^+$-type contact layer 18 is formed, in place of the Schottky electrode 15, on an emission surface 14 of an electron-emitting layer 13. An ohmic electrode 19 consisting of AuGe is formed on the surface of the contact layer 18 to be in ohmic contact with the contact layer 18.

In the transition electron type photocathode with this arrangement, a p-n junction is formed between the $p^-$ type electron-emitting layer 13 and the $n^+$ type contact layer 18. A bias voltage applied to the two ohmic electrodes 16 and 19 is set to a value necessary and sufficient to extend a depletion layer from the p-n junction throughout a light-absorbing layer 12.

In this embodiment as well, since a potential gradient is formed throughout the light-absorbing layer 12 of the photocathode, all photoelectrons excited upon incidence of light are accelerated on the basis of an electric field in the light-absorbing layer 12 and the electron-emitting layer 13. Therefore, differences in transit time of photoelectrons can be largely decreased to realize a photocathode with a high response speed.

Third Embodiment

In this embodiment, a bias voltage higher than the conventional voltage for optimizing the S/N ratio is applied to the photocathode of the first or second embodiment, which is arranged in a head-on type photomultiplier, thereby forming a potential gradient throughout a light-absorbing layer. Therefore, this embodiment largely decreases differences in transit time of photoelectrons to increase the response speed for detecting external incident light.

Figure 5:
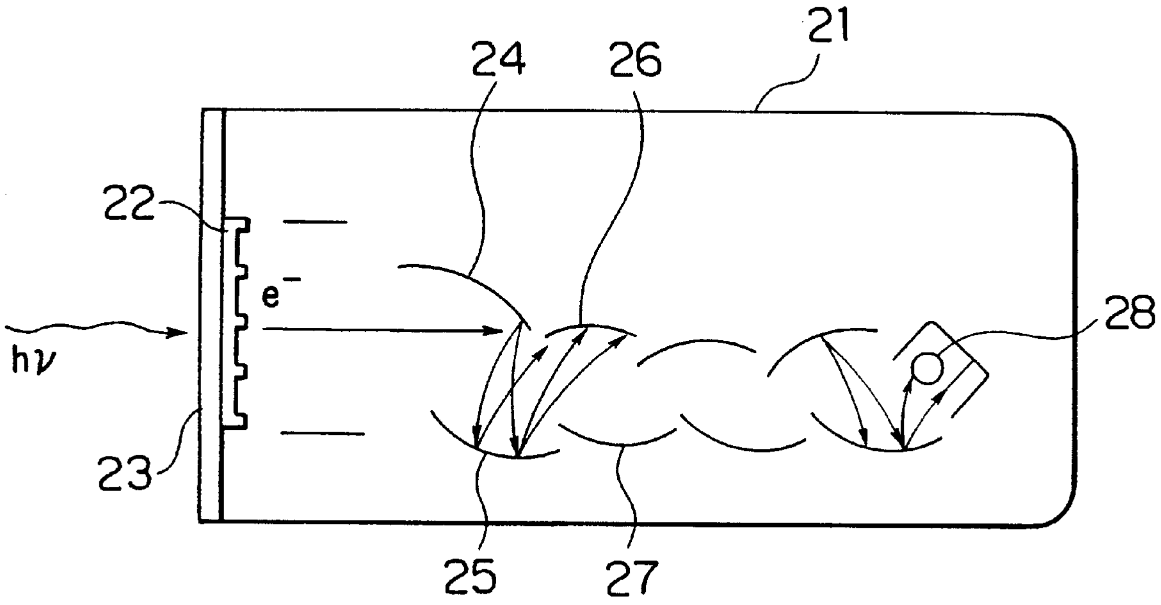
FIG. 5 is a sectional view showing the arrangement of a head-on type photomultiplier applied to the third embodiment according to the present invention.

As shown in FIG. 5, a photocathode 22 is fixed on the surface of an incident window 23 of a valve 21 held in a vacuum state. The photocathode 22 has the same structure as that of the first or second embodiment. A bias voltage applied to the photocathode 22 is set to a value necessary and sufficient to form a potential gradient throughout a light-absorbing layer 12.

With this arrangement, when external light hν is incident on the photocathode 22 through the incident window 23, all photoelectrons excited by the incident light hν in the light-absorbing layer 12 become accelerated electrons and are emitted from an emission surface 14 of an electron-emitting layer 13 into the vacuum. Photoelectrons $e^-$ emitted from the photocathode 22 into the vacuum are incident on a first dynode 24 of an electron multiplication unit to generate secondary electrons.

The photoelectrons including the secondary electrons emitted into the vacuum are subjected to secondary electron multiplication by a second dynode 25, a third dynode 26, a fourth dynode 27, . . . The photoelectrons are finally multiplied up to about $10^6$ times, reach an anode 28, and are output as a signal current to the outside.

Figure 6:
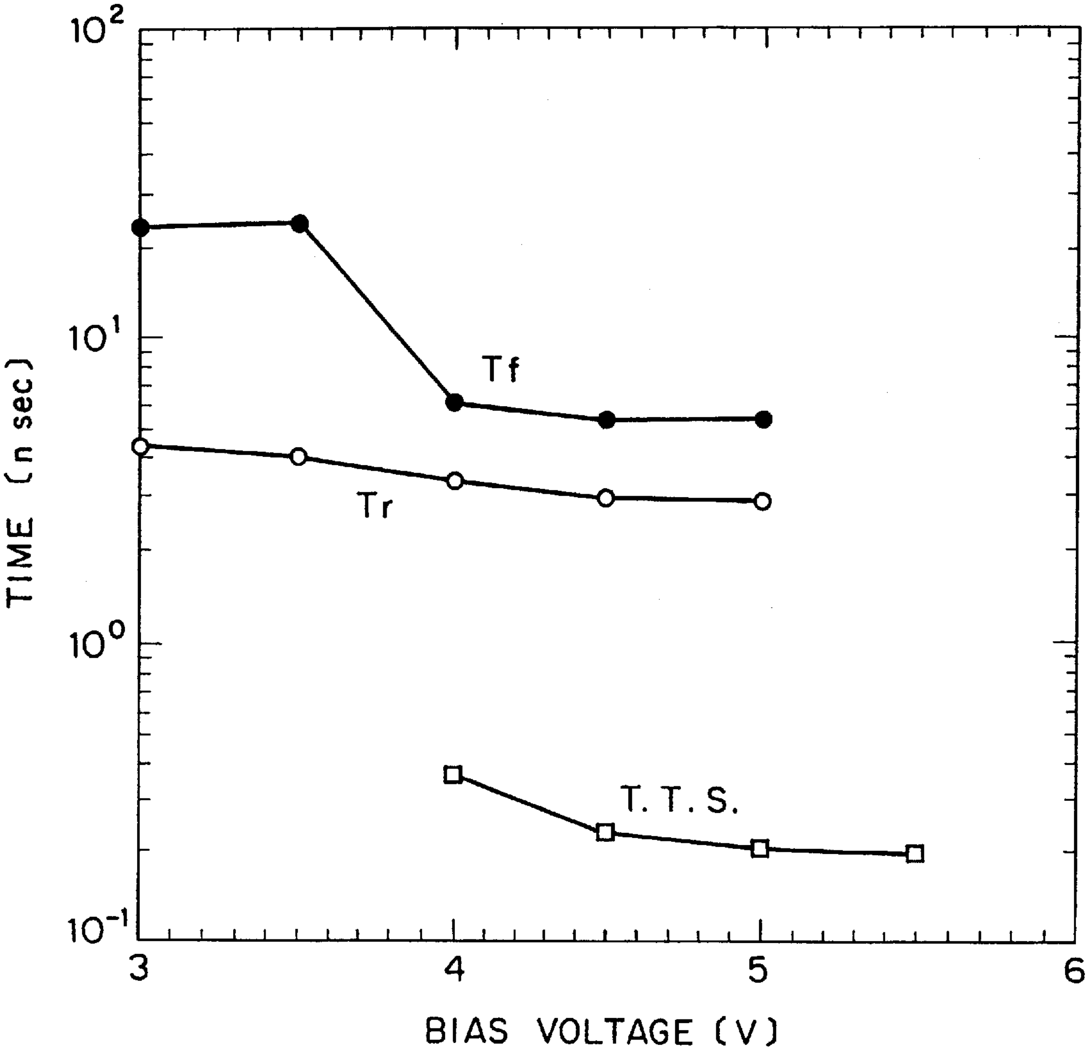
FIG. 6 is a graph showing time response characteristics with respect to a bias voltage in the photomultiplier shown in FIG. 5.

Referring to FIG. 6, a bias voltage [V] is plotted along the abscissa, and a rise time and a fall time [ns] are plotted along the ordinate. The response characteristics of rise/fall of an output signal is measured while changing the bias voltage in correspondence with incidence of very short pulse light. The rise response characteristics are represented by a characteristic curve Tr, and the fall response characteristics are represented by a characteristic curve Tf.

When the bias voltage is increased, the fall time of an output signal abruptly decreases from 23 ns to 5.2 ns with respect to a predetermined value of the bias voltage. More specifically, when the bias voltage is increased, the fall response time abruptly decreases at a bias voltage of about 4.5 V although the rise response time hardly changes.

This result represents that accelerated electrons and diffused electrons are simultaneously present at a bias voltage of 4.5 V or less, a potential gradient is formed throughout the light-absorbing layer at a bias voltage of 4.5 V or more, and at this time, all the photoelectrons become accelerated electrons. Therefore, in this embodiment, the time response of the photomultiplier can be greatly improved.

Fourth Embodiment

In this embodiment, a bias voltage higher than the conventional voltage for optimizing the S/N ratio is applied to the photocathode of the first or second embodiment, which is arranged in a side-on type photomultiplier, thereby forming a potential gradient throughout a light-absorbing layer.

Figure 7:
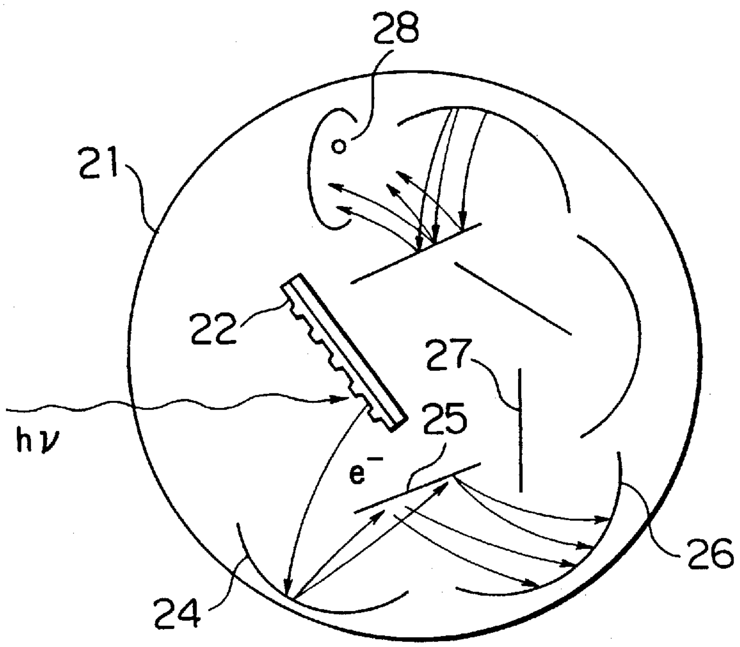
FIG. 7 is a sectional view showing the arrangement of a side-on type photomultiplier applied to the fourth embodiment according to the present invention.

As shown in FIG. 7, a photocathode 22 is arranged in a valve 21 held in a vacuum state to oppose the side wall of the valve 21 as an incident window. A first dynode 24, a second dynode 25, a third dynode 26, a fourth dynode 27, . . . , and an anode 28 are sequentially, arranged along the side wall about the axis of the valve 21.

The photocathode 22 has the same structure as that of the first or second embodiment. A bias voltage applied to the photocathode 22 is set to a value necessary and sufficient to form a potential gradient throughout a light-absorbing layer 12. All photoelectrons become accelerated electrons, as in the third embodiment. Therefore, the time response of the photomultiplier can be greatly improved.

Fifth Embodiment

In this embodiment, a bias voltage higher than the conventional voltage for optimizing the S/N ratio is applied to the photocathode of the first or second embodiment, which is arranged in an image intensifier, thereby forming a potential gradient throughout a light-absorbing layer. Therefore, this embodiment largely decrease differences in transit time of photoelectrons to improve a gate function for precisely detecting external incident light.

Figure 8:
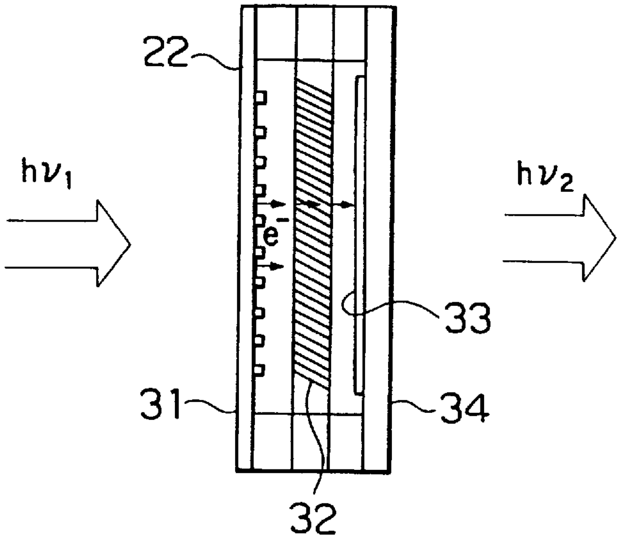
FIG. 8 is a sectional view showing the arrangement of an image intensifier applied to the fifth embodiment according to the present invention.

As shown in FIG. 8, a photocathode 22 also serving as an incident window of a valve is arranged in a valve held in a vacuum state. The photocathode 22 has the same structure as that of the first or second embodiment. A bias voltage applied to the photocathode 22 is set to a value necessary and sufficiently to form a potential gradient throughout a light-absorbing layer 12.

With this arrangement, when external light $h\nu_1$ is focused on an incident surface 31 of the photocathode 22 as a target measurement image, all photoelectrons excited by the incident light $h\nu_1$ in the light-absorbing layer 12 become accelerated electrons which are emitted into the vacuum and guided to a microchannel plate (MCP) 32 supported by the side wall of the valve.

The photoelectrons incident on the MCP 32 are two-dimensionally multiplied in correspondence with the optical image of the incident light $h\nu_1$, and thereafter, incident on a phosphor 33 arranged on the stem of the valve to emit exit light $h\nu_2$. The optical image of the light hν, emitted from the phosphor 33 emerges as an intensified image of the optical image of the incident light $h\nu_1$.

In a general image intensifier, particularly when target measurement light is pulse light, a degradation in measurement precision caused by a dark current is suppressed by applying a gate photodetecting method. More specifically, only when target measurement light is incident, a gate is opened to perform measurement. While no target measurement light is incident, the gate is kept closed not to perform measurement.

For example, when the potential of the photocathode 22 is increased/decreased with respect to the potential of the incident surface of the MCP 32 to perform a gate operation on the nano-second order, a high-speed pulse applied to the photocathode 22 must have a rise/fall time of 1 ns or less and an amplitude of about 200 V. In addition, a current capacity of about several A and an impedance matching are also required, resulting in a complex gate circuit.

In this embodiment, a gate operation can be performed by turning on/off a bias voltage of only several V applied to the photocathode 22. When the gate circuit is arranged close to the image intensifier, impedance matching becomes unnecessary, so that a relatively simple gate circuit can be obtained.

Figure 9:
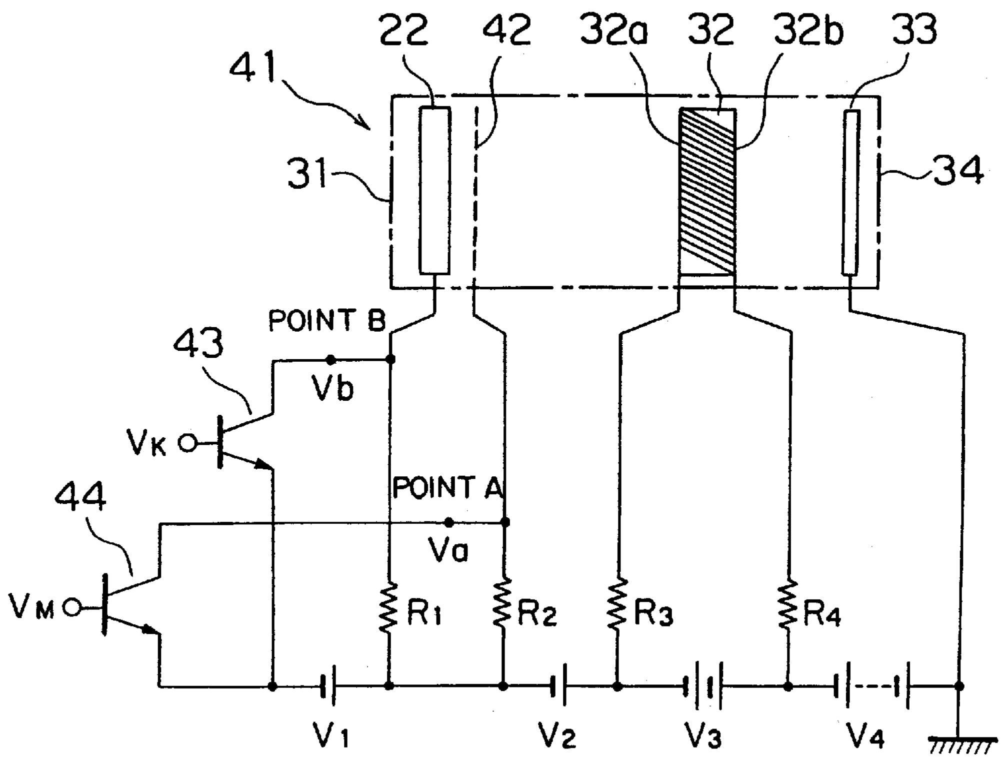
FIG. 9 is a block diagram showing a gate circuit connected to the image intensifier in FIG. 8, which functions in a normally closed mode.

As shown in FIG. 9, a predetermined voltage for accelerating photoelectrons is applied to the photocathode 22 and the phosphor 33. In addition, a predetermined voltage for biasing the interior of the photocathode 22 is applied to a mesh electrode 42 arranged on an emission surface 14 of the photocathode 22. Furthermore, a predetermined voltage for multiplying the photoelectrons is applied to an incident surface 32*a* and an exit surface 32*b* of the MCP 32.

When the gate function is executed in a normally closed mode, the positive electrode of an accelerating power supply $V_4$ of a power supply unit is connected to the phosphor screen 33 in a ground state. The negative electrode of the accelerating power supply $V_4$ is connected to the positive electrode of an MCP main power supply $V_3$ and also connected to the exit surface 32*b* of the MCP 32 through an exit surface resistor $R_4$.

The negative electrode of the MCP main power supply $V_3$ is connected to the positive electrode of a mesh bias power supply $V_2$ and also connected to the incident surface 32*a* of the MCP 32 through an incident surface resistor $R_3$. The negative electrode of the mesh bias power supply $V_2$ is connected to the positive electrode of a photocathode bias power supply $V_1$ and also connected to the mesh electrode 42 through a mesh electrode resistor $R_2$, and an ohmic electrode 16 of the photocathode 22 through a photocathode resistor $R_1$.

The collector of an avalanche transistor 43 serving as a first semiconductor switch is connected to a point B as a connecting point between the photocathode 22 and the photocathode resistor $R_1$. The collector of an avalanche transistor 44 serving as a second semiconductor switch is connected to a point A as a connecting point between the mesh electrode 42 and the mesh electrode resistor $R_2$. The emitters of the two avalanche transistors 43 and 44 are connected to the negative electrode of the photoelectric surface bias power supply $V_1$.

An output voltage from the MCP main power supply $V_3$ is variably set within a range of 500 to 900 V. An output voltage from the accelerating power supply $V_4$ is set to about 6,000 V. In the initial state, a mesh voltage Va is equal to a photocathode voltage Vb. Therefore, the photocathode 22 does not operate, and no photoelectron is emitted.

Figure 10:
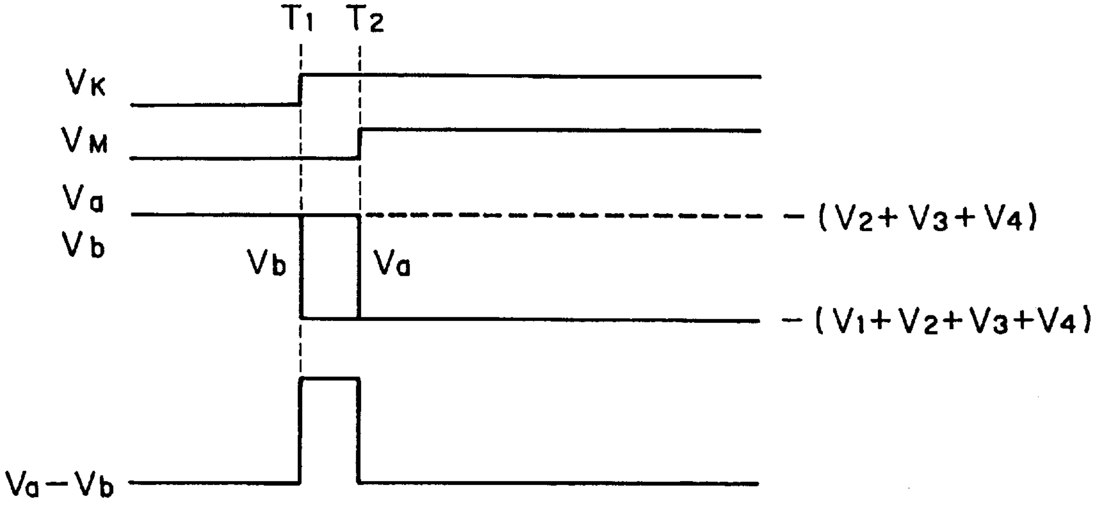
FIG. 10 is a timing chart of various signals for causing a gate operation of the gate circuit in FIG. 9 for the image intensifier in FIG. 8.

As shown in FIG. 10, when a voltage $V_K$ is applied to the base of the avalanche transistor 43, the avalanche transistor 43 is turned on at time $T_1$. At this time, the photocathode voltage Vb is $-(V_1+V_2+V_3+V_4)$, and the mesh voltage Va is $-(V_2+V_3+V_4)$. Since an output voltage from the photocathode bias power supply $V_1$ is applied between the photocathode 22 and the mesh electrode 42, the photocathode 22 operates. Note that the output voltage from the photocathode bias power supply $V_1$ is several V.

On the other hand, when a voltage $V_M$ is applied to the base of the avalanche transistor 44, the avalanche transistor 44 is turned on at time $T_2$. At this time, the mesh voltage Va is $-(V_1+V_2+V_3+V_4)$ which is equal to the photocathode voltage Vb. The photoelectric surface 22 does not operate, and no photoelectron is emitted. Therefore, only during a period from time $T_1$ to time $T_2$, when the difference (Va−Vb) between the mesh voltage Va and the photocathode voltage Vb becomes positive, the gate of an image intensifier 41 is opened for a short time.

That is, in the image intensifier of this embodiment, the gate operation can be performed by turning on/off a low voltage of several V applied between the mesh electrode 42 and the photocathode 22. Therefore, a high-speed gate circuit can be realized with a very simple circuit arrangement.

In this embodiment, a gate circuit which works in a normally closed mode has been described. However, a gate circuit which works in a normally open mode can also be similarly realized with a simple arrangement.

A means for realizing an image intensifier having a gate function is not limited to the above-described circuit arrangement. This image intensifier can also be realized with another circuit arrangement.

In this embodiment, a gate operation performed using an image intensifier has been described.

However, the electron tube is not limited to an image intensifier. This embodiment can also be applied to a conventional photomultiplier, MCP photomultiplier, electron injection type photomultiplier, streak tube, and the like, as a matter of course. More specifically, this embodiment can substantially be applied to an electron tube having a photocathode structure for forming a potential gradient throughout a light-absorbing layer upon application of a bias voltage.

Sixth Embodiment

In this embodiment, a bias voltage higher than the conventional voltage for optimizing the S/N ratio is applied to the photocathode of the first or second embodiment, which is arranged in a streak tube, thereby forming a potential gradient throughout a light-absorbing layer. Therefore, this embodiment largely decreases differences in transit time of photoelectrons to improve the gate function for precisely detecting external incident pulse light.

Figure 11:
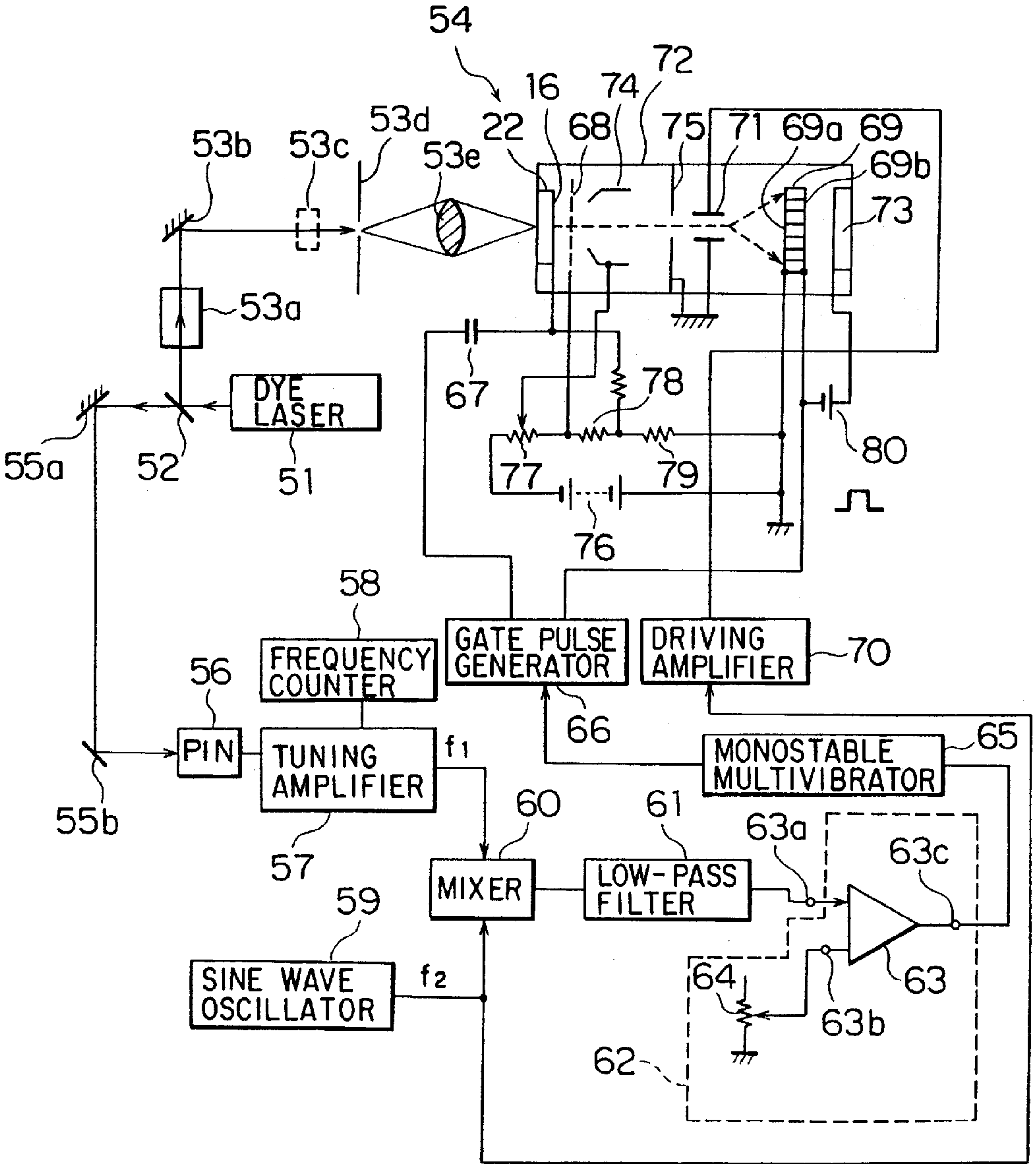
FIG. 11 is a block diagram showing the arrangement of a streak device including a streak tube applied to the sixth embodiment according to the present invention.

As shown in FIG. 11, a dye laser oscillator 51 can emit a laser beam having a pulse width of about 5 ps at a repetition period selected from a range of 80 to 200 MHz. A semitransparent mirror 52 constituting a beam splitter branches the pulse laser beam emitted from the dye laser oscillator 51 into two systems. One of the pulse laser beams branched by the semitransparent mirror 52 is incident on a photocathode 22 of a streak tube 54 via an optical system comprising an optical path length adjusting device 53*a*, a reflecting mirror 53*b*, a slit lens 53*c*, a aperture 53*d*, a condenser lens 53*e* and the like.

In the streak tube 54, the photocathode 22 is arranged on the incident surface of a hermetic vessel 72, and a phosphor 73 is arranged on the stem of the hermetic vessel 72. A mesh electrode 68 is formed on the vacuum-side surface of the photocathode 22 to extend in a direction perpendicular to the sweeping direction of photoelectrons emitted from the photocathode 22 upon incidence of a pulse laser beam.

In the hermetic vessel 72, a focusing electrode 74, an aperture electrode 75, a deflecting electrode 71, and an MCP 69 are arranged between the photocathode 22 and the fluorescent 73 while being supported by the side wall of the hermetic vessel 72.

The other of the pulse laser beams branched by the semitransparent mirror 52 is incident on a PIN photodiode 56 via an optical system comprising reflecting mirrors 55*a* and 55*b*. The PIN photodiode 56 outputs a pulse current to a tuning amplifier 57 at a very high response speed in response to incidence of a pulse laser beam.

The tuning amplifier 57 operates at a center wavelength, i.e., at a frequency set to be equal to the oscillation frequency of the dye laser oscillator 51, thereby sending a first sine wave synchronized with the repetition frequency of the pulse current input from the PIN photodiode 56 to a mixer 60. Note that the tuning amplifier 57 can set a frequency selected from a range of 80 to 200 MHz as a center wavelength. A frequency counter 58 counts the frequency of the first sine wave input from the tuning amplifier 57 and displays the frequency.

That is, the semitransparent mirror 52, the PIN photodiode 56, and the tuning amplifier 57 constitute a first sine wave oscillator for generating a first sine wave synchronized with a high-speed repetition pulse light incident on the photocathode 22 of the streak tube 54.

A sine wave oscillator 59 is constituted as a second sine wave oscillator for outputting a second sine wave at a frequency slightly different from that of the first sine wave to the mixer 60 and a driving amplifier 70. Note that the sine wave oscillator 59 can send a sine wave at a frequency selected from a range of 80 to 200 MHz.

The mixer 60 mixes the first and second sine waves output from the first and second sine wave oscillators. A low-pass filter 61 extracts, from the synthetic wave output from the mixer 60, a low-frequency component lower than a frequency which is slightly higher than the frequency difference between the first and second sine waves. A level detector 62 detects the level of a signal output from the low-pass filter 61.

That is, the mixer 60, the low-pass filter 61, and the level detector 62 constitute a phase detector for detecting a point of time when a predetermined phase relationship is established between outputs from the first and second sine wave oscillators and outputting a detection signal to a monostable multivibrator 65.

For example, when the dye laser oscillator 51 sends pulse light at a frequency of 100 MHz, a first sine wave at a frequency of 100 MHz is sent from the tuning amplifier 57, and the frequency counter 58 displays the frequency "100 MHz". The operator reads the frequency "100 MHz" displayed on the frequency counter 58 and adjusts the sine wave oscillator 59, thereby sending a second sine wave at a frequency of (100+Δf) MHz for Δf<<100.

The mixer 60 mixes a first sine wave $f_1$ at a frequency of 100 MHz output from the first sine wave oscillator and a second sine wave $f_2$ at a frequency of (100+Δf) MHz output from the second sine wave oscillator, thereby outputting a synthetic wave having an amplitude f represented by the following equation to the low-pass filter 61:

$$
\begin{aligned}
f &= f_1 \times f_2 \\
&= A\sin(2\times 10^8 \pi t) \times B\sin(2\times 10^8 \pi t + 2\pi\Delta f t) \\
&= A \cdot B/2 \cdot \{\cos(2\pi\Delta f t) - \cos(4\times 10^8 \pi t + 2\pi\Delta f t)\}
\end{aligned}
$$

where A and B are arbitrary real numbers, $f_1$=Asin(2×$10^R$ πt), and $f_2$=Bsin(2×$10^8$ πt°2πΔft).

The low-pass filter 61 is a filter for passing a low-frequency component lower than a frequency which is slightly higher than a frequency Δf. Therefore, the low-pass filter 61 passes only a low-frequency component f'=A·B/2·cos(2πΔft) from the synthetic wave output from the mixer 60 and outputs this frequency component to one input terminal 63*a* of a comparator 63 constituting the level detector 62. Note that the slide end of a potentiometer 64 is connected to the other input terminal 63*b* of the comparator 63.

The comparator 63 outputs a pulse signal from an output terminal 63*c* to the input terminal of the monostable multivibrator 65 when the voltage input to one input terminal 63*a* becomes higher than that input to the other input terminal 63*b*. The monostable multivibrator 65 is started at the rise of the pulse signal output from the comparator 63 and falls after a predetermined period of time.

A gate pulse generator 66 outputs a gate voltage to an ohmic electrode 16 formed on the emission surface of the photocathode 22 of the streak tube 54 through a capacitor 67 when the signal output from the monostable multivibrator 65 is in an ON state and also outputs the gate voltage to the mesh electrode 68. When the gate pulse generator 66 generates a gate voltage, a voltage of −800 V is applied to the ohmic electrode 16 of the photocathode 22, and a voltage of +900 V is applied to an output-side electrode 69*b* of the MCP 69.

The second sine wave output from the sine wave oscillator 59 is amplified by the driving amplifier 70 and applied to the deflecting electrode 71 of the streak tube 54. The amplitude of the second sine wave applied to the deflecting electrode 71 is 1,150 V from a voltage of −575 V to a voltage of +575 v. A voltage from +100 V to −100 V within this amplitude is used to sweep photoelectrons.

An input-side electrode 69*a* of the MCP 69 and the aperture electrode 75 are grounded. On the basis of a power supply 76 and three dividing resistors 77 to 79, a potential of 4,000 V is set at the ohmic electrode 16 of the photocathode 22 while a potential of −4,500 V is set at the focusing electrode 74. On the basis of a power supply 80, a potential higher than that of the output-side electrode 69*b* of the MCP 69 by 3,000 V is set at the phosphor screen 73.

While the gate pulse generator 66 generates no gate voltage, no photoelectron is emitted from the photoelectric surface 22, and no multiplied electron is emitted from the MCP 69. Therefore, the phosphor screen 73 is held in a dark state.

When the gate pulse generator 66 generates a gate voltage, photoelectrons excited in the photocathode 22 are accelerated by the potential of the mesh electrode 68 and emitted into the vacuum held in the hermetic vessel 72. The photoelectrons emitted from the photocathode 22 are focused by an electron lens formed by the focusing electrode 74 to the opening of the aperture electrode 75 and guided to a region between two electrode plates of the deflecting electrode 71.

At this time, when the second sine wave output from the sine wave oscillator 59 is applied to the deflecting electrode 71, the photoelectrons are deflected and guided to the MCP 69. The deflecting electrode 71 moves the incident position of the photoelectrons from the upper end to the lower end of the MCP 69 in correspondence with a deflecting voltage ranging from +100 V to −100 V. The photoelectrons incident on the MCP 69 are multiplied, emitted from the MCP 69, and incident on the phosphor screen 73 to form a streak image.

As described above, the gate pulse generator 66 continuously generates a gate voltage during a period longer than a plurality of periods of the first sine wave output from the first sine wave oscillator, on the basis of a gate pulse received from the monostable multivibrator 65 which have received a detection signal output from the phase detector. The streak tube 54 performs a substantial operation during only a period while a gate voltage is generated. For this reason, an increase in ground level of the phosphor screen 73 caused by thermoelectrons amplified except for this period can be prevented.

Therefore, a streak image formed upon detection of target measurement light as pulse light can be observed in an excellent state with a sufficiently reduced S/N ratio. In the present invention, a gate voltage of several V which is much lower than that of the prior art is set, and a substantial photocathode is formed to extend in a direction perpendicular to the sweep direction. For this reason, a high-speed gate operation can be performed.

As has been described above in detail, in the methods of using a photocathode and an electron tube of the present invention, a necessary and sufficient voltage is applied between the first electrode and the second electrode arranged to sandwich a laminated heterostructure of Group III–V compound semiconductors including a substrate, a light-absorbing layer, and an electron-emitting layer, thereby forming a potential gradient throughout the light-absorbing layer. With this arrangement, all photoelectrons excited in the light-absorbing layer drift as accelerated electrons along the potential gradient formed in the light-absorbing layer and reach the emission surface of the electron-emitting layer.

Differences in transit time of photoelectrons from the excited position in the light-absorbing layer up to the emission surface of the electron-emitting layer can be largely decreased as compared to the conventional photocathode, thereby realizing a photocathode with a high response speed. Therefore, in an electron tube having a photocathode with such a function, the measurement precision of time-resolved measurement can be greatly improved by largely decreasing the differences in response time.

When a pulse voltage is applied between the first electrode and the second electrode, the photocathode can be easily and quickly operated as an electron gate. In an electron tube such as a photomultiplier, an image intensifier, and a streak tube having a photocathode with this function, a very-high-speed gate operation can be easily performed. Therefore, the S/N ratio or time resolving power can be improved.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 38852/1995 filed on Feb. 27, 1995 is hereby incorporated by reference.

What is claimed is:

1. A method of using a photocathode comprising a laminated heterostructure of Group III–V semiconductors, said photocathode having:

- a p-type substrate;
- a p-type light-absorbing layer consisting of a single layer formed on, and directly contacting, said substrate, photoelectrons being excited in said light-absorbing layer which absorbs external incident light;
- a p-type electron-emitting layer consisting of a single layer formed on, and directly contacting, said light-absorbing layer and having an emission surface;
- a first electrode formed on said emission surface to have a rectifying function with respect to said electron-emitting layer; and a second electrode formed in ohmic contact with said substrate, the method comprising:

applying a voltage necessary and sufficient to form a potential gradient entirely across both said light-absorbing layer and said electron-emitting layer between said first electrode and said second electrode;

whereby photoelectrons excited in said light-absorbing layer are accelerated toward said electron-emitting layer by an electric field generated between said substrate and said electron-emitting layer, and the accelerated photoelectrons are emitted outside of said photocathode through said electron-emitting layer while said voltage is applied between said first electrode and said second electrode.

2. A method according to claim 1, wherein said first electrode is formed in Schottky contact with said electron-emitting layer.

3. A method according to claim 1, wherein said photocathode further comprises an n-type contact layer formed on said electron-emitting layer, and said first electrode is formed in ohmic contact with said contact layer.

4. A method according to claim 1, wherein a pulse voltage is applied between said first electrode and said second electrode to operate said photocathode as an electron gate.

5. A method according to claim 1, wherein said substrate is formed of a material for transmitting light having a predetermined wavelength, and said photocathode is arranged as a transmission type photocathode to emit the photoelectrons along a propagation direction of the light passing through said substrate.

6. A method according to claim 1, wherein said electron-emitting layer is formed of a material for transmitting light having a predetermined wavelength, and said photocathode is arranged as a reflection type photocathode to emit the photoelectrons against a propagation direction of the light passing through said electron-emitting layer.

7. A method of using an electron tube having a photocathode comprising a laminated heterostructure of Group VIII–V semiconductors, said photocathode having:

a p-type substrate;

a p-type light-absorbing layer consisting of a single layer formed on, and directly contacting, said substrate, photoelectrons being excited in said light-absorbing layer which absorbs external incident light;

a p-type electron-emitting layer consisting of a single layer formed on, and directly contacting said light-absorbing layer and having an emission surface;

a p-type electron-emitting layer formed on said light-absorbing layer said electron-emitting layer having a higher conduction band than said light-absorbing layer;

a first electrode formed on said emission surface to have a rectifying function with respect to said electron-emitting layer; and a second electrode formed in ohmic contact with said substrate, said method comprising:

applying a voltage necessary and sufficient to form a potential gradient entirely across both said light-absorbing layer and said electron-emitting layer between said first electrode and said second electrode;

whereby photoelectrons excited in said light-absorbing layer are accelerated toward said electron-emitting layer by an electric field generated between said substrate and said electron-emitting layer, and the accelerated photoelectrons are emitted outside of said photocathode through said electron-emitting layer while said voltage is applied between said first electrode and said second electrode.

8. A method according to claim 7, wherein said electron tube is constituted as a photomultiplier.

9. A method according to claim 7, wherein said electron tube is constituted as an image intensifier.

10. A method according to claim 7, wherein said electron tube is constituted as a streak tube.

11. A method according to claim 7, wherein said first electrode is formed in Schottky contact with said electron-emitting layer.

12. A method according to claim 7, wherein said photocathode further comprises an n-type contact layer formed on said electron-emitting layer, and said first electrode is formed in ohmic contact with said contact layer.

13. A method according to claim 7, wherein a pulse voltage is applied between said first electrode and said second electrode to operate said photocathode as an electron gate.

14. A method according to claim 7, wherein said substrate is formed of a material for transmitting light having a predetermined wavelength, and said photocathode is arranged as a transmission type photocathode to emit the photoelectrons along a propagation direction of the light passing through said substrate.

15. A method according to claim 7, wherein said electron-emitting layer is formed of a material for transmitting light having a predetermined wavelength, and said photocathode is arranged as a reflection type photocathode to emit the photoelectrons against a propagation direction of the light passing through said electron-emitting layer.

16. A method according to claim 11, wherein said electron tube is constituted as a streak tube, and said first electrode is formed to extend in direction perpendicular to a sweep direction of the photoelectrons.

17. A method according to claim 12, wherein said electron tube is constituted as a streak tube, and said contact layer is formed to extend in direction perpendicular to a sweep direction of the photoelectrons.

* * * * *